(12) United States Patent
Edel

(10) Patent No.: US 6,479,976 B1
(45) Date of Patent: Nov. 12, 2002

(54) METHOD AND APPARATUS FOR ACCURATE MEASUREMENT OF PULSED ELECTRIC CURRENTS UTILIZING ORDINARY CURRENT TRANSFORMERS

(76) Inventor: Thomas G. Edel, 9232 N. Tyler Ave., Portland, OR (US) 97203-2356

(*) Notice: Subject to any disclaimer, the term of this patent is extended or adjusted under 35 U.S.C. 154(b) by 0 days.

(21) Appl. No.: 09/894,384

(22) Filed: Jun. 28, 2001

(51) Int. Cl.$^7$ .............................................. H01F 38/28
(52) U.S. Cl. ..................................... 323/357; 361/143
(58) Field of Search ............................... 323/355–358; 361/143, 146, 149, 267

(56) References Cited

U.S. PATENT DOCUMENTS

| | | | | |
|---|---|---|---|---|
| 4,182,982 A | * | 1/1980 | Wolf et al. ................. | 323/357 |
| 4,967,145 A | * | 10/1990 | Davies ....................... | 323/355 |
| 5,896,027 A | * | 4/1999 | So et al. ..................... | 323/357 |
| 6,028,422 A | | 2/2000 | Preusse | |
| 6,160,697 A | | 12/2000 | Edel | |

* cited by examiner

*Primary Examiner*—Jeffrey Sterrett
*Assistant Examiner*—Gary L. Laxton

(57) ABSTRACT

A voltage source connected in the secondary circuit of a current transformer is controlled so as to provide a secondary current that is accurately and continuously proportional to a primary current that is either pulsed d-c electric current or pulsed a-c electric current. Similar to U.S. Pat. No. 6,180,697, the voltage source is controlled so as to compensate for the voltage drop caused by secondary current flowing through secondary circuit impedances, thereby reducing the effective burden of the secondary circuit. However, to prevent the accumulation of error when measuring pulsed currents that are not symmetrical, the present invention turns the burden-reducing compensation off whenever secondary current is near zero amperes, thereby providing for the decay of current error and magnetic flux, so that current error remains very small and the current transformer does not saturate. The primary application is thought to be in the accurate measurement and control of pulsed electric current utilizing an ordinary current transformer to provide isolation from the primary circuit.

23 Claims, 5 Drawing Sheets

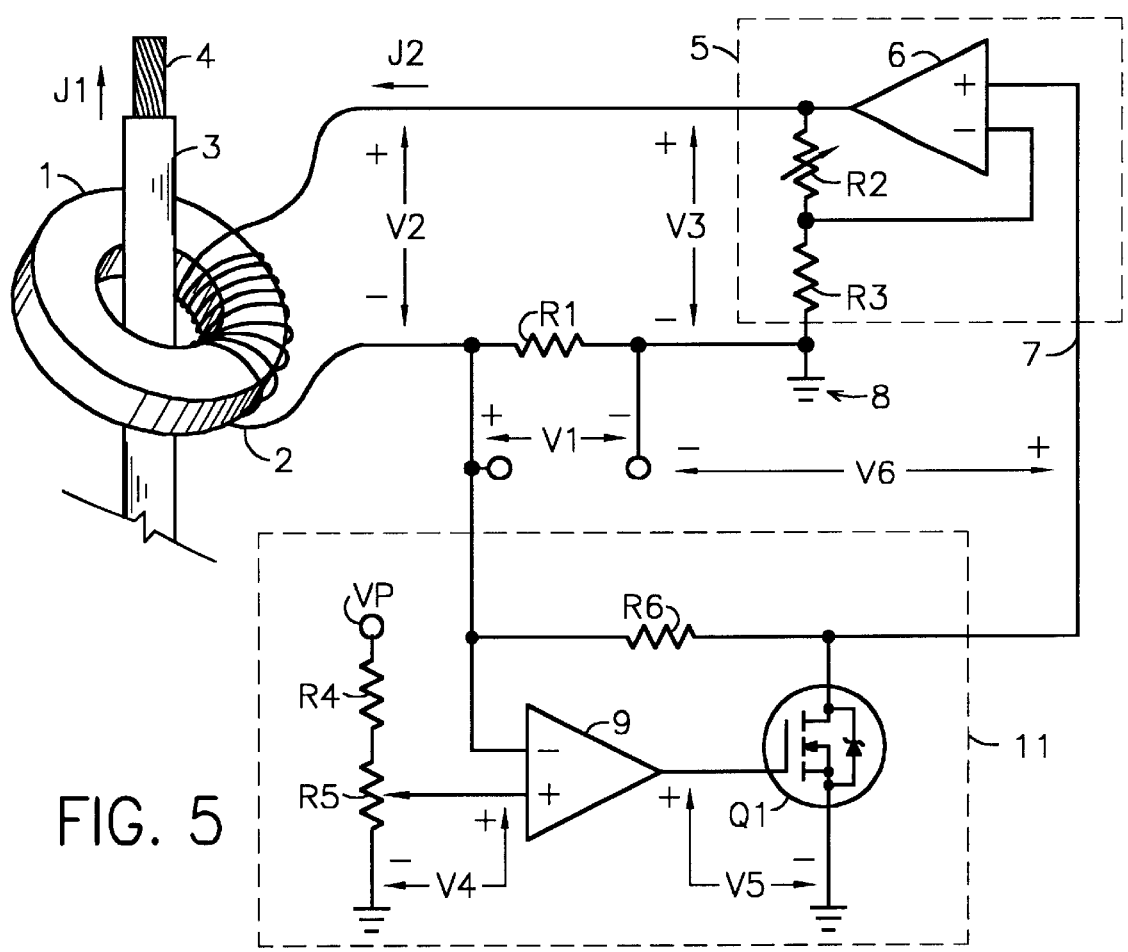
FIG. 5
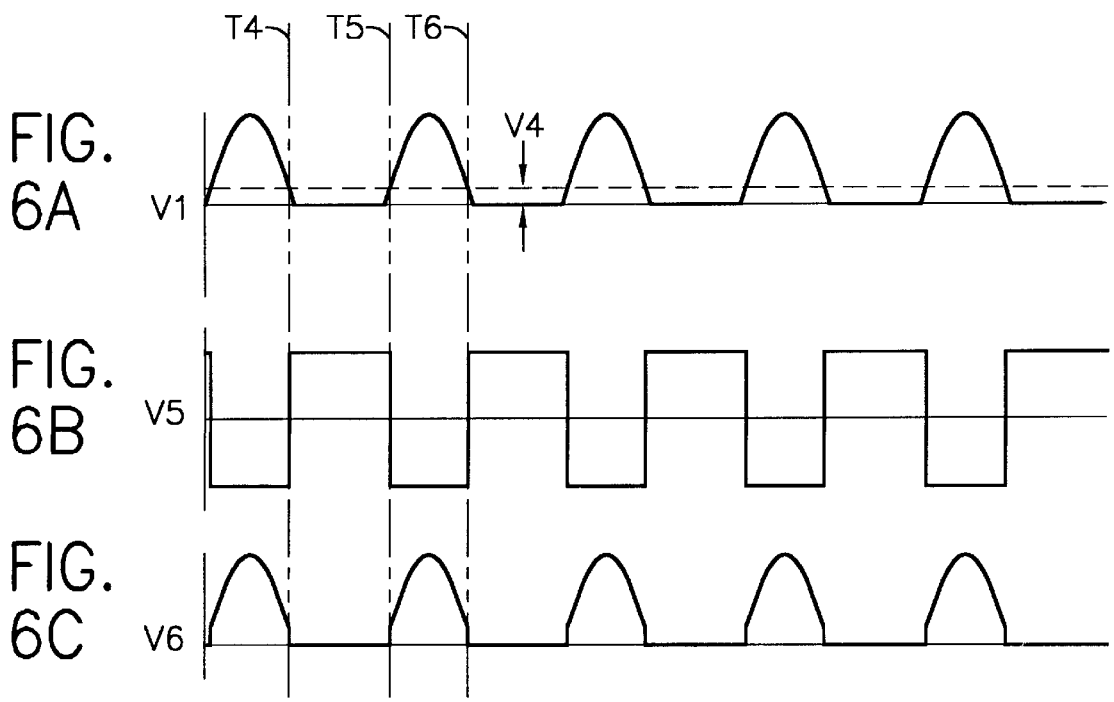
FIG. 6A  V1
FIG. 6B  V5
FIG. 6C  V6

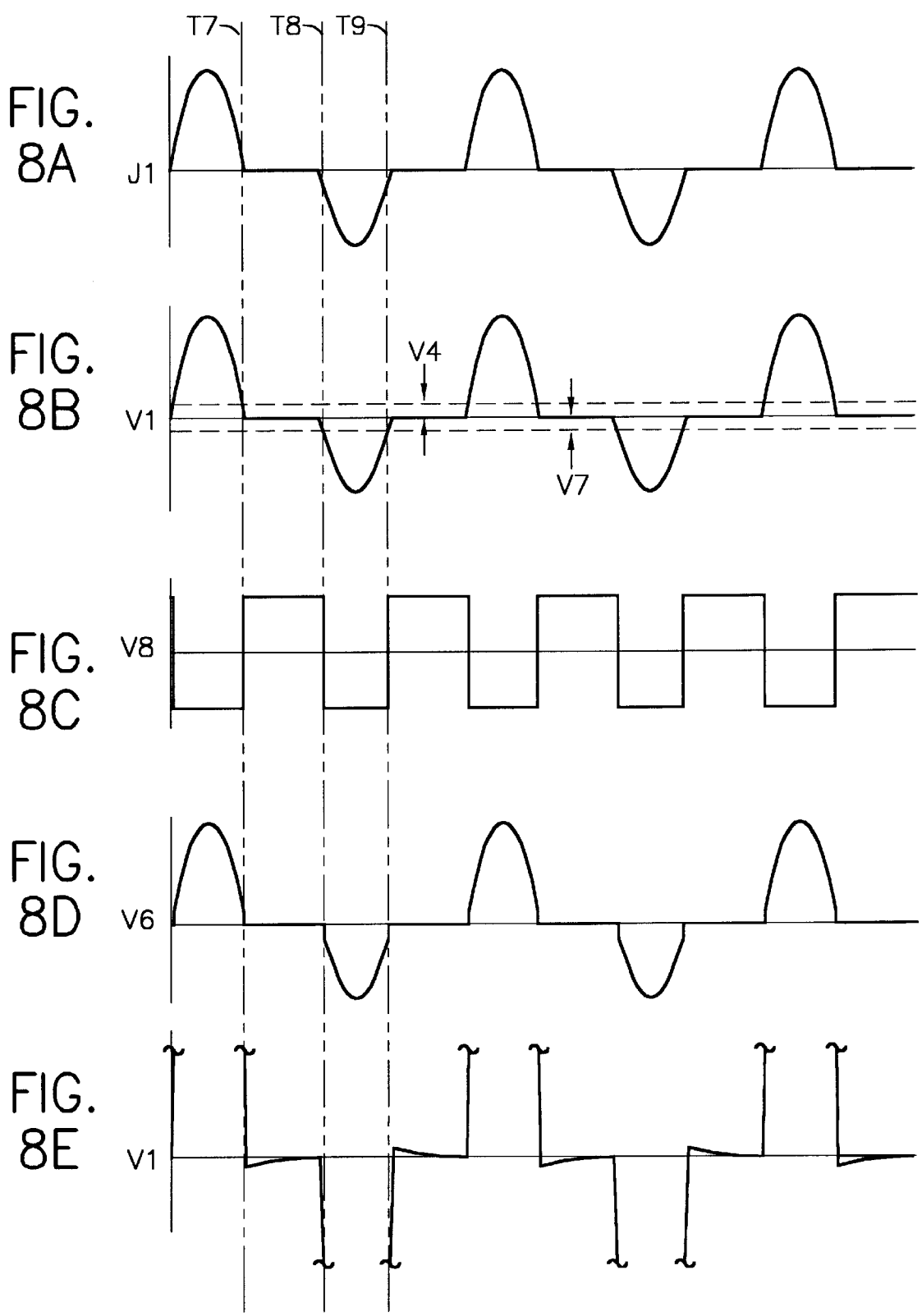

METHOD AND APPARATUS FOR ACCURATE MEASUREMENT OF PULSED ELECTRIC CURRENTS UTILIZING ORDINARY CURRENT TRANSFORMERS

BACKGROUND OF THE INVENTION

Current transformers are widely used in the measurement of alternating electric current. Current transformers provide an isolated secondary current that is proportional to, and smaller than, the primary current that is being measured. The primary winding of a current transformer is connected in series with the primary current that is to be measured. A secondary winding is magnetically coupled to the primary winding by a suitable magnetic core. The secondary winding is normally connected to a load that has low impedance so that secondary current can flow freely. A secondary current is induced in the secondary winding by magnetic coupling of the primary winding to the secondary winding, the magnetic coupling being strengthened by the magnetic core that is common to both windings. The secondary current is proportionally smaller than the primary current by the turns ratio of the primary and secondary windings (not taking current transformer errors into account). The primary winding frequently consists of only one turn, which is often just a current-carrying conductor installed through an opening in the middle of the current transformer magnetic core. The secondary winding usually consists of multiple turns wrapped around the magnetic core.

In order for the secondary current generated by a current transformer to be an accurate representation of the primary current, the impedance of the secondary circuit must be kept low so that current can flow freely. The impedance of the secondary circuit is often called the "burden." The burden generally includes all impedances in the loop through which the secondary current flows, including stray winding impedances, stray impedances of connecting conductors, and the impedances of any other components connected in the loop (such as current-sensing resistors and relay operating coils). In order for a current transformer to drive a secondary current through a non-zero burden, a voltage must be induced in the secondary winding. The induced voltage is proportional to secondary current and is proportional to the burden, in accordance with Ohm's law (voltage equals current times impedance). The induced voltage is induced in the secondary winding by a fluctuating induction level in the magnetic core (the induced voltage is proportional to the rate of change of magnetic flux in accordance with Faraday's Law). The fluctuating induction level is associated with a magnetizing current in accordance with well-known electromagnetic principles. The magnetizing current accounts for most of the error in the secondary current. Generally speaking, the accuracy of a current transformer is inversely related to the burden of the secondary circuit. A higher burden causes the secondary current to be a less accurate representation of the primary current.

FIG. 1 illustrates one prior-art configuration that is commonly used to sense alternating current. A primary current J1 flows in a primary conductor 4 which has an insulating covering 3, both of which pass through a magnetic core 1. Primary conductor 4 functions as a primary winding with only one turn. Though shown with one end disconnected, primary conductor 4 is normally connected as part of a larger electrical or electronic system. Magnetic core 1 has a secondary winding 2 wrapped around the core to form a current transformer. Winding 2 is shown with ten turns around magnetic core 1, though the actual number of turns may vary widely depending on the application. Magnetic core 1 is shown as a toroid, though wide variation in current transformer configurations is possible. Secondary winding 2 is connected to a current-sensing resistor RI having relatively low resistance to allow a secondary current J2 to flow freely. Secondary current J2 is normally smaller than primary current J1 by the turns ratio of the current transformer. Current J2 flows through resistor R1, thereby generating a voltage signal V1, which is instantaneously proportional to current J2. Voltage signal V1 is usually connected as an input to a larger current monitoring or control system (not shown). If an ideal system were possible (not having current transformer errors and other component imperfections), voltage signal V1 would be precisely instantaneously proportional to primary current J1.

The primary weakness of ordinary current transformers is their inability to measure d-c current when simply connected to a passive linear burden. While the configuration shown in FIG. 1 functions well with balanced a-c primary currents (with no d-c components), it does not function well with unbalanced currents. For example, FIG. 4A shows primary current J1 as a rectified current waveform (this is one form of pulsed d-c current). FIG. 4B shows the secondary current waveform that is typically produced by the configuration shown in FIG. 1. Times T1, T2, and T3 are included for ease of reference and comparison. The waveform is distorted and has a large "zero offset error" (the d-c offset error, which is most obvious whenever primary current is zero amps and secondary current is not zero amps). While the amount of distortion varies greatly between different kinds of current transformers, the large zero offset error generally does not vary much.

FIG. 2 shows a prior-art configuration that may be used to eliminate the zero offset error when measuring pulsed d-c currents. A diode D1 is added in series with resistor R1 to prevent zero offset error in the secondary current. This diode adds additional burden to the secondary circuit, thereby contributing somewhat to distortion of the secondary current waveform, as illustrated by FIG. 4C (with the waveform of FIG. 4A representing the primary current). The amount of distortion present may vary widely, depending on the particular components utilized and the magnitude of the primary current. FIG. 4D shows a typical waveform for voltage V2 (the secondary winding voltage of the configuration shown in FIG. 2). The negative part of the waveform is the sum of the diode forward voltage drop and voltage signal V1. The positive part of the waveform is the reverse voltage across the diode as the diode prevents negative current from flowing. The peak magnitude of this positive pulse increases significantly as the accuracy of the current transformer is improved (by selecting current transformers better suited to this measurement configuration). This large voltage pulse is magnetically coupled to the primary circuit, and may cause problems in applications that are sensitive to noise.

In order to measure d-c current accurately and in an isolated manner, it is common practice to use devices generally known as "Hall-effect current sensors." These sensors generally combine a Hall-effect sensor and a magnetic core in various ways to enable the measurement of d-c currents and a-c currents (symmetrical or unsymmetrical, with or without d-c components). Though Hall-effect current sensors are widely used, their cost is sometimes prohibitive, and many Hall-effect current sensors lack stability over time, and may therefore require frequent recalibration.

One alternative to Hall-effect current sensors is disclosed in U.S. Pat. No. 6,160,697 to Edel, issued Dec. 12, 2000.

That patent describes how a voltage source (or, more generally, a "voltage device") may be connected in the secondary circuit of an ordinary current transformer and controlled in such a way so as to control the induction level of the current transformer core. In one embodiment, the voltage source is controlled to implement a demagnetizing sequence that demagnetizes the current transformer. After such a demagnetizing sequence, the current transformer is able to measure d-c current for a limited time period (after this time period another demagnetizing sequence is required). However, secondary current is corrupted during the brief demagnetizing sequence, so d-c current cannot be measured continuously utilizing this method.

U.S. Pat. No. 6,160,697 also describes how the voltage device may be controlled to effectively reduce the burden of the entire secondary circuit to near zero ohms, thereby greatly increasing the accuracy of ordinary current transformers. This "burden-reducing" means is utilized in the present invention to minimize current transformer error by reducing the rate that magnetic flux builds up in the current transformer core. However, burdenreducing alone cannot prevent eventual saturation of the current transformer core when measuring d-c currents or unsymmetrical a-c currents. One embodiment of this prior-art burden-reducing circuit is shown in FIG. 3.

In FIG. 3, an op amp 6 has voltage gain controlled by variable resistor R2 and resistor R3, to form a controllable voltage device 5. Voltage signal V1 is connected as a feedback signal to voltage device 5 by a conductor 7. With this configuration, output voltage V3 is proportional to, and larger than, voltage signal V1, and has polarity so as to facilitate flow of secondary current J2. By adjusting the gain of the op amp (by adjusting variable resistor R2), the voltage drop associated with current J2 flowing through all secondary circuit resistances can be counteracted so that the effective secondary burden is greatly reduced. Secondary circuit resistances normally include winding resistance, the resistance of connecting wires, and the resistance of current-sensing resistor R1. Ground symbol 8 represents a reference potential of zero volts. As shown in FIG. 4E, the configuration shown in FIG. 3 accurately reproduces the waveform of the primary current, but still has large zero offset error.

The burden-reducing circuit of FIG. 3 compensates for the voltage drop caused by secondary current flowing through secondary circuit resistances, but does not compensate for the voltage drop associated with secondary circuit stray reactances. However, compensation for the voltage drop associated with stray reactive impedances may also be provided to reduce the effective burden of the secondary circuit still more. This may be done in several ways. First, complex impedances may be substituted for one or both of resistors R2 and R3, thereby adjusting the magnitude and phase angle of output voltage V3 as required to further reduce the effective burden (as illustrated later in FIG. 7). Alternatively, a reactance (such as an inductor) may be added in series with resistor R1 to adjust the phase angle of feedback voltage signal V1, thereby causing voltage V3 to have the same phase angle as the sum of the loop impedances. Third, some form of PID control (Proportional-plus-Integral-plus-Derivative control) may be installed in the feedback loop to improve compensation for complex stray reactances. Fourth, a digital control system may be utilized to implement almost any kind of control scheme that may be applicable, including digital PID methods and fuzzy logic.

BRIEF SUMMARY OF THE INVENTION

The present invention utilizes an ordinary current transformer to provide a secondary current that is continuously proportional to a primary current; the primary current being either pulsed d-c current or pulsed a-c current (symmetrical or unsymmetrical). The most common application for the invention is thought to be in electric current measurement and control systems, providing a way to accurately measure pulsed current utilizing an ordinary current transformer to provide isolation from the primary circuit. In accordance with prior art (FIG. 3, and also U.S. Pat. No. 6,180,697), a voltage device is connected in series with the secondary winding of a current transformer. The voltage device is controlled to produce an output voltage that compensates for the voltage drop associated with secondary current flowing through secondary impedances, thereby reducing the effective burden of the secondary circuit. This sharply reduces the rate that flux builds-up in the current transformer core, thereby also reducing the rate that secondary current error increases, thereby improving the accuracy of the current transformer.

The present invention improves upon the prior art by turning the burden-reducing compensation off whenever secondary current is near zero amps, thereby providing a way for error in the secondary current to decay relatively fast and thus remain very small. The magnetic core of the current transformer is thereby also prevented from saturating, so pulsed d-c current (and pulsed a-c current) can be continuously and accurately measured.

The invention is applicable to any primary current that periodically has a magnitude of approximately zero amps for nonzero periods of time. This includes pulsed d-c current and pulsed a-c current, including unsymmetrical pulsed a-c current.

The invention may be used with sinusoidal a-c primary currents, however the ability to reproduce any d-c component that is present is lost. For sinusoidal currents, the length of time that current is at zero amps at each zero-crossing is not normally defined or measurable. When utilized with sinusoidal a-c primary currents, the invention provides accuracy improvement similar to prior-art active current transformers (without the ability to measure d-c components).

Accordingly, some objects and advantages of the present invention are:

(a) The invention provides a relatively simple way of accurately and continuously measuring pulsed d-c electric current utilizing an ordinary current transformer for isolation.

(b) The invention provides a relatively simple way of accurately and continuously measuring pulsed a-c electric current utilizing an ordinary current transformer for isolation, regardless of whether or not the a-c current is symmetrical or has an average value of zero.

Further objects and advantages will become apparent from a consideration of the drawings and the following detailed description.

BRIEF DESCRIPTION OF THE DRAWINGS

FIG. 5 illustrates a simple embodiment of the invention configured for the measurement of pulsed d-c electric current, utilizing analog control means.

FIGS. 6A, 6B, and 6C illustrate some waveforms associated with the embodiment shown in FIG. 5.

FIGS. 8A through 8E illustrate some waveforms associated with the embodiment shown in FIG. 7.

Items that are common to more than one figure are identified by the same reference characters.

DETAILED DESCRIPTION OF THE INVENTION

Drawings showing prior art (FIGS. 1, 2, 3, 4B, 4C, 4D and 4E) are discussed above under "Background Art."

Figure 1:
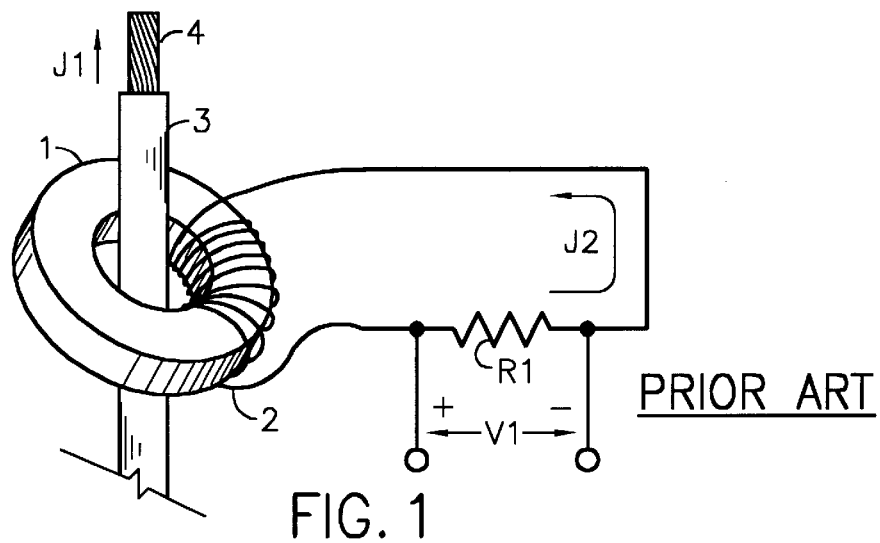
FIG. 1 illustrates a simple prior-art current transformer configuration that is widely used for the measurement of a-c electric current, but which does not function well when primary current is unbalanced (has an average value that is not zero).
Figure 2:
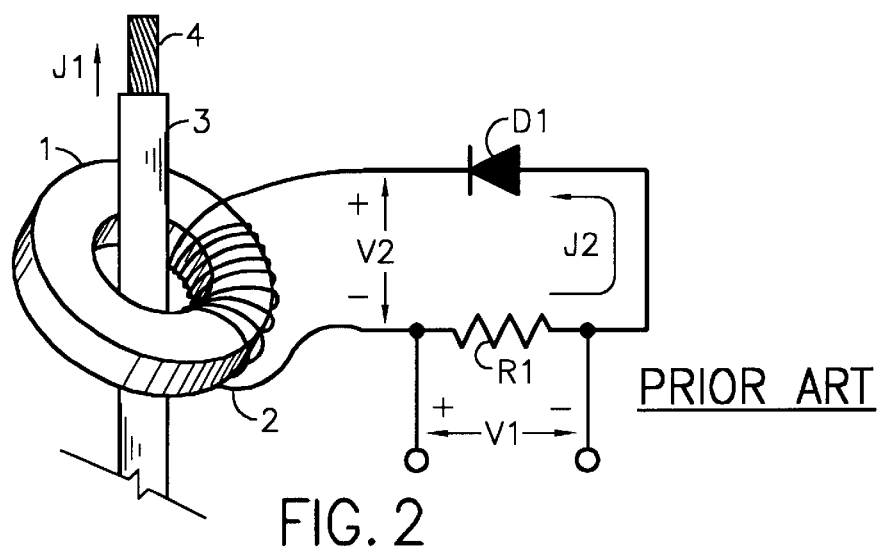
FIG. 2 illustrates a prior-art configuration that has been utilized for measuring rectified a-c current (and other pulsed d-c currents). However, accuracy is poor when utilized with many types of current transformers.
Figure 3:
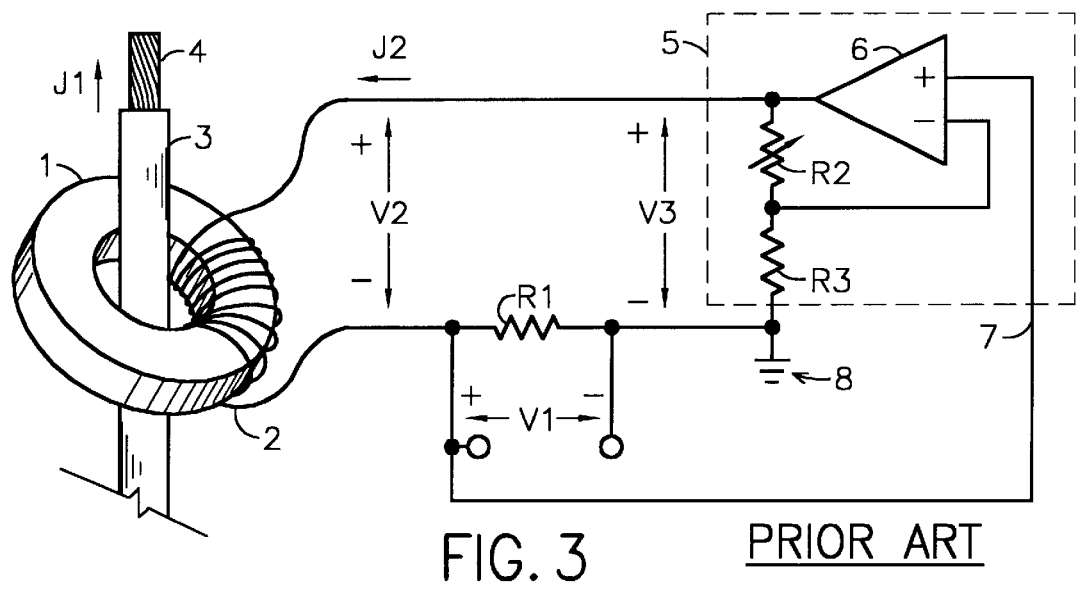
FIG. 3 illustrates a prior-art configuration that reduces the effective burden of the secondary circuit to improve current transformer accuracy. This configuration reproduces an unbalanced waveform accurately, but loses any d-c component that is present in the primary current.

FIG. 5 illustrates a simple embodiment of the invention intended for measurement of pulsed d-c current. FIG. 5 incorporates a burden-reducing circuit similar to FIG. 3. However, the configuration of FIG. 3 is now modified by adding feedback controls 11. Feedback controls 11 operate to reduce the feedback voltage signal to very near zero volts whenever the magnitude of secondary current is less than a small predetermined value. This turns the burden-reducing circuit off when secondary current is very small, thereby providing a way for secondary current error to naturally and quickly decay and remain near zero amperes.

More specifically, in FIG. 5 a resistor R4 and potentiometer R5 are connected in series between ground potential and a power supply positive voltage VP to provide an adjustable reference voltage V4 that is positive and small. A voltage comparator 9 compares reference voltage V4 to voltage signal V1. Whenever voltage signal V1 is greater than reference voltage V4 the output voltage of comparator 9 is driven low so that fieldeffect transistor Q1 is turned off When this is the case, the embodiment of FIG. 5 operates in a burden-reducing manner similar to the configuration of FIG. 3 (transistor Qi does not conduct, and voltage signal V1 is conducted to voltage device 5 via a resistor R6 and conductor 7). k this mode, output voltage V3 has instantaneous magnitude approximately proportional to the instantaneous magnitude of secondary current J2, and has polarity so as to facilitate the flow of secondary current J2. Transistor Q1 is an enhancement-mode N-channel device.

Whenever voltage signal V1 is less than reference voltage V4, the output voltage of comparator 9 is driven high, thereby turning field-effect transistor Q1 on so that feedback conductor 7 is grounded, thereby preventing voltage signal V1 from being conducted to voltage device 5. This effectively turns the burden-reducing compensation off so that whenever the magnitude of secondary current is smaller than a predetermined value (reference voltage V4 divided by the resistance of current-sensing resistor R1) output voltage V3 is approximately zero volts. The resistance of resistor R6 must be large compared to current-sensing resistor R1 to avoid adversely affecting current-sensing accuracy. Likewise, comparator 9 should have high input impedance so that current-sensing accuracy is not adversely affected.

Figure 4:
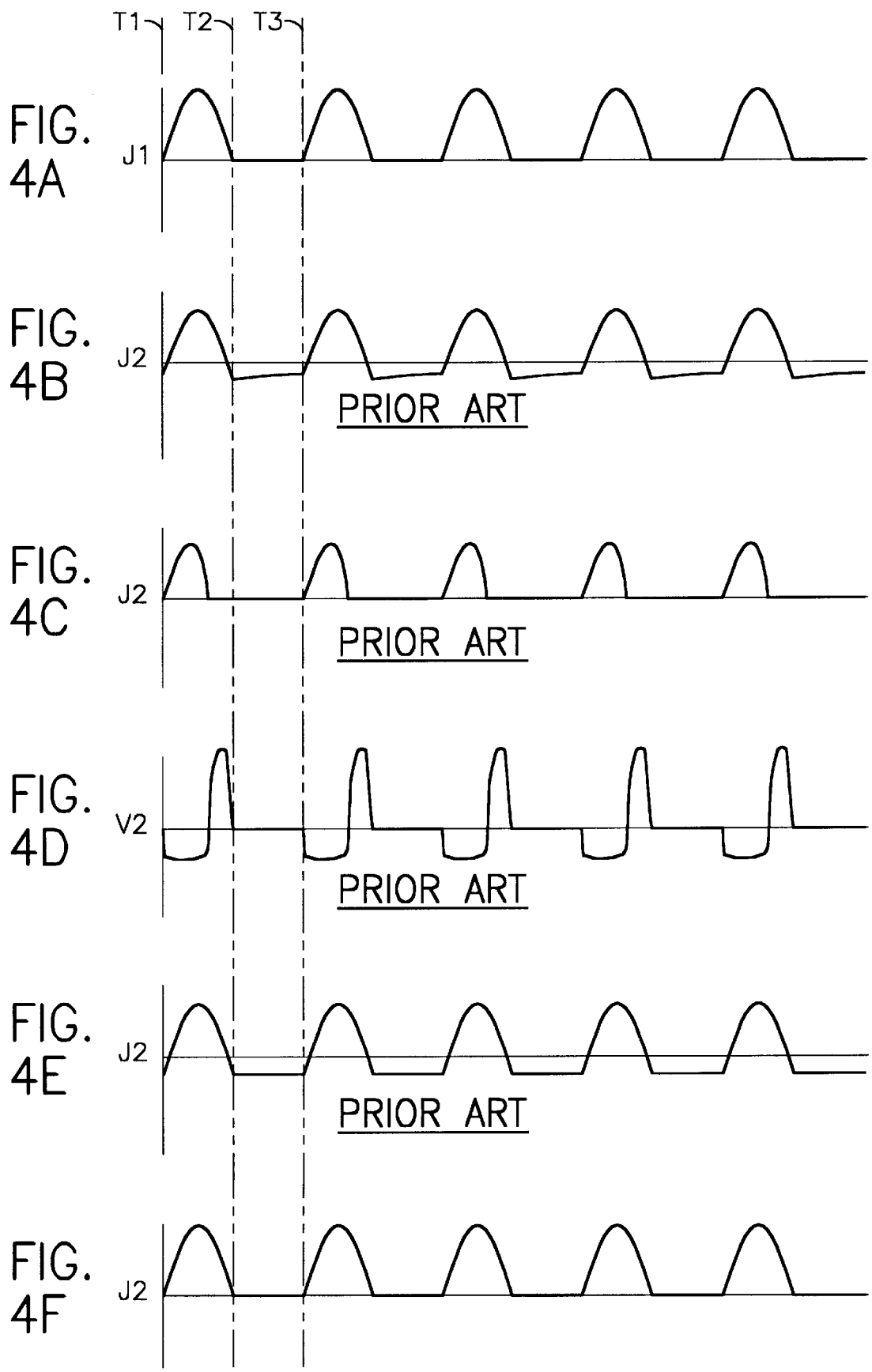
FIG. 4A illustrates a primary current waveform used as reference waveform. The waveform shown is approximately a rectified sinusoid.
FIG. 4B illustrates a typical secondary current that is generated when the prior-art configuration of FIG. 1 is used to measure the primary current shown in FIG. 4A.
FIG. 4C illustrates a typical secondary current that is generated when the prior-art configuration of FIG. 2 is used to measure the primary current shown in FIG. 4A.
FIG. 4D illustrates typical secondary voltage that is generated when the prior-art configuration of FIG. 2 is used to measure the primary current shown in FIG. 4A.
FIG. 4E illustrates a typical secondary current that is generated when the prior-art configuration of FIG. 3 is used to measure the primary current shown in FIG. 4A.
FIG. 4F illustrates the secondary current that is generated by the present invention when measuring the primary current shown in FIG. 4A.

FIGS. 4A and 4F and FIGS. 6A through 6C illustrate waveforms associated with the embodiment of FIG. 5. FIG. 4A shows the reference primary current J1, which is approximately a rectified sinusoid. FIG. 4F shows the same waveform for secondary current J2, since the invention provides a secondary current that is accurately proportional to the primary current. FIG. 6A again shows the same waveform for voltage signal V1, since this voltage is proportional to current J2. FIG. 6B shows voltage V5, which is the output voltage of comparator 9 and the gate voltage of transistor Q2. Times T4, T5, and T6 indicate points of time at which the comparator output changes state due to the magnitude of voltage signal V1 transitioning through the magnitude of reference voltage V4. FIG. 6C shows the resulting feedback voltage V6 conducted by conductor 7. Output voltage V3 is proportionally larger than voltage V6, but has the same waveform as voltage V6.

Figure 7:
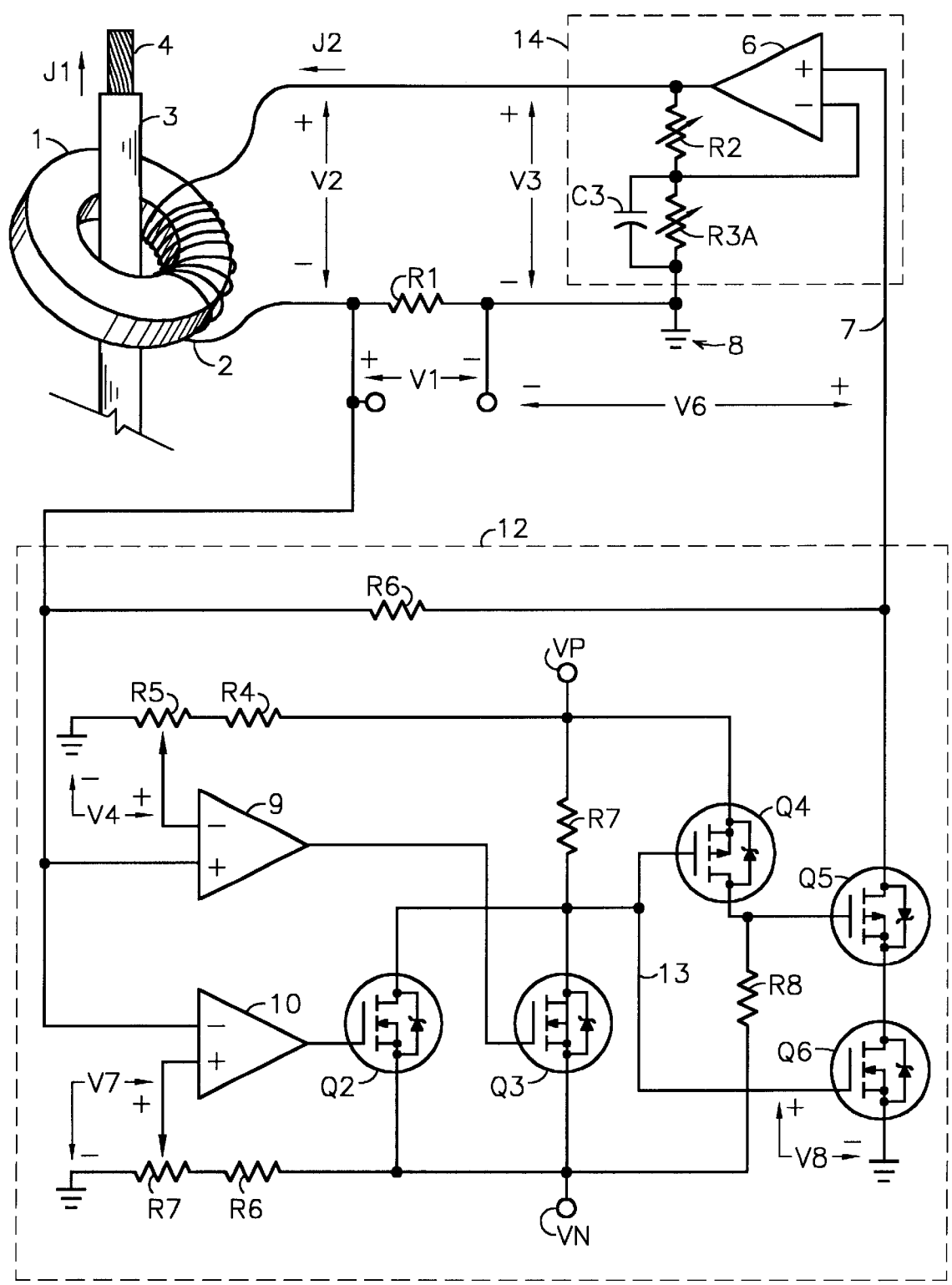
FIG. 7 illustrates an alternate embodiment of the invention configured for the measurement of either pulsed d-c current or pulsed a-c current, utilizing analog control means.

FIG. 7 illustrates an alternate embodiment of the invention intended for measurement of pulsed a-c current or pulsed d-c current. Operation is similar to FIG. 5, except that feedback controls 12 are configured for bipolar operation. A second comparator 10 is configured to compare voltage signal Vi with a small negative reference voltage V7. Reference voltage V7 is generated by a resistor R6 and a potentiometer R7 connected in series between ground potential and a power supply negative voltage VN. Comparator 9 is now configured to provide low output voltage whenever voltage signal V1 is less than reference voltage V4, and comparator 10 is configured to provide low output voltage whenever voltage signal V1 is higher than reference voltage V7. Field-effect transistors Q2 and Q3 are configured as a NOR logic circuit such that voltage V8 (conductor 13) is pulled high by resistor R7 whenever voltage signal V1 is between reference voltage V4 and reference voltage V7. This turns on field-effect transistors Q5 and Q6, thereby grounding feedback conductor 7, whenever the magnitude of voltage signal V1 is very small. Field-effect transistor Q4 and resistor R8 are configured to provide proper gate-driving voltages for transistor Q5. Transistors Q2, Q3, and Q6 are enhancement-mode N-channel devices, while transistors Q4 and Q5 are enhancement-mode P-channel devices.

In FIG. 7, voltage device 14 is configured to provide burden-reducing compensation for stray inductive reactance in the secondary circuit (in addition to compensation for secondary circuit resistance). This is done by changing resistor R3 (of FIG. 5) to a variable resistor R3A in parallel with a capacitor C3. By adjusting variable resistors R2 and R3A, both the magnitude and phase angle of output voltage V3 relative to voltage V6 are adjustable. By properly adjusting these two variable resistors, burden-reducing compensation is provided for both resistive and inductive components of secondary circuit impedances. When properly adjusted, the instantaneous magnitude of output voltage V3 is approximately equal to the instantaneous magnitude of the voltage drop associated with current J2 flowing through secondary circuit impedances.

Of course, for greater simplicity, voltage device 5 shown in FIG. 5 may be substituted for voltage device 14 shown in FIG. 7. Likewise, in order to improve the burden-reducing accuracy of the embodiment shown in FIG. 5, voltage device 14 shown in FIG. 7 may be substituted for voltage device 5 shown in FIG. 5.

FIGS. 8A through 8E illustrate waveforms associated with the operation of FIG. 7. FIG. 8A shows a reference primary current, which is an unbalanced pulsed a-c current (having a nonzero average value). Times T7, T8, and T9 are included for reference and ease of comparison.

Since the invention provides an accurate secondary current, the waveform of current J2 is almost identical to primary current J1 (current J2 is not shown). The waveform of voltage signal V1 is proportional to current J2, and is shown in FIG. 8B.

FIG. 8C shows control voltage V8 on conductor 13, which controls transistors Q5 and Q6. Whenever this voltage is high, the burden-reducing circuit is turned off.

FIG. 8D shows the resulting waveform of feedback voltage V6 on conductor 7.

FIG. 8E again shows voltage signal V1 (previously shown in FIG. 8B), but with the vertical scale magnified to show how current error quickly decays between current pulses. The rate of decay is primarily dependent on current transformer characteristics and total loop resistance. The initial magnitude and polarity of the current error (immediately after a current pulse) are dependent on the accuracy of the burden-reducing circuit.

In an alternate embodiment, the control circuit and voltage device may be configured so that the output voltage opposes current flow whenever secondary current is very small, thereby increasing the rate that current error decays between pulses, thereby improving accuracy somewhat.

It should be readily understood, by those skilled in the art, that it is not necessary that the burden-reducing circuit instantaneously compensate for voltage drop for the invention to work. It is sufficient that the average value over time of the voltage device's output voltage during a current pulse be approximately equal to the average value over time of the voltage drop during a current pulse (the voltage drop caused by secondary current flowing through secondary circuit impedances). As long as these average values are approximately equal, the induction level and current error at the end of a current pulse will be only slightly different than at the beginning of the current pulse. With this in mind, it should be apparent that the voltage device utilized could be configured to merely provide two or three discrete output voltages switched in such a way that the average output voltage approximately equals the average voltage drop.

The preferred embodiments utilize a current-sensing impedance to generate a voltage signal which is part of a control circuit which controls the output voltage of the voltage device. An alternate embodiment may utilize a third current transformer winding to sense changes in core flux level, and use the voltage signal from this third winding to control the output voltage of the voltage device. This type of control applied as a burden-reducing circuit is illustrated by FIG. 34 of U.S. Pat. No. 6,180,607.

The invention may also be embodied utilizing many other control means. For example, a microcontroller maybe utilized, similar to FIG. 31 of U.S. Pat. No. 6,180,697. In that configuration, an analog-to-digital converter is used to convert the voltage signal across a current-sensing resistor into digital format, a microcontroller performs required calculations digitally, and a digital-to-analog converter is used to interface to an analog voltage device. To embody the present invention, the microcontroller need only be reprogrammed to implement the principles described herein.

Clarifications

Finally, some clarifications will be discussed. Throughout this disclosure, the term "magnetic core" or simply "core" is intended to refer to a magnetic body that is in a particular spatial relationship to one or more current-carrying conductors. The term "magnetic body" is used in a general sense to refer to a mass of magnetic material. The term "magnetic material" refers to material that has a relative permeability significantly greater than a value of one. The term "induction level" is intended to be synonymous with magnetic flux density.

Current transformer cores made from "round loop" magnetic materials will generally work better with the invention than cores made with "square loop" materials (square loop materials are characterized by very high remnant magnetization relative to peak magnetization). Utilizing the invention, a magnetic core is not strictly required for two "windings" to function as a current transformer, since the burden-reducing circuit reduces the amount of magnetic coupling that is required between the two coils.

While windings utilized throughout industry are most commonly made of copper or aluminum conductors, it should be understood that the present invention is not limited to standard types of windings. Windings of widely varying form made of almost any kind of conductive material may be utilized, including superconducting materials and semiconducting materials.

The term "impedance" is used in a general sense and includes devices or components having nonzero resistance or reactance (or a combination of the two), and includes devices with linear and nonlinear characteristics. The term "current-sensing impedance" refers to any impedance connected in series with an electric current for the purpose of obtaining a voltage signal across the impedance that is directly related to the electric current and the characteristics of the current-sensing impedance. Current-sensing impedances include the well-known current-sensing resistor often seen in current transformer secondary circuits, as well as complex impedances having non-zero reactive components.

Unless winding current is kept very small, the voltage measurable across a winding differs from the induced voltage by an amount that depends on characteristics of winding current and characteristics of stray winding impedances.

Stray impedances associated with a winding may be defined to include not only the effects of conductor resistance and stray inductance, but may also be defined to include the effects of eddy currents, core losses and other imperfections associated with a particular core/winding combination. Stated another way, the stray impedances of a winding may be defined in whatever way results in the most effective burden-reducing compensation.

Although some of the preferred embodiments of the invention utilize a controllable active "voltage source" to produce the output voltages required for proper operation, in more general terms a controllable "voltage device" may be utilized. The term "voltage source" usually indicates an electric energy source having output voltage that is relatively unaffected by current magnitude. The term "voltage device" is intended to include any kind of device that is capable of providing the appropriate voltages and currents (while not necessarily being configured as a voltage source).

Conclusions, Ramifications, and Scope

The present invention provides an improved way of providing a secondary electric current that is proportional to, and isolated from, a primary electric current. The invention is especially suited for use in systems that measure (and/or control) pulsed electric currents.

While two different embodiments have been described and illustrated, there are many other embodiments possible that will be apparent to those skilled in the art. It is not the intent of this disclosure to limit the invention to the embodiments that have been illustrated. The components and configurations utilized in this disclosure are intended to be illustrative only, and are not intended to limit the scope of the appended claims.

While only certain preferred features of the invention have been shown by way of illustration, many modifications and changes will occur to those skilled in the art. It is, therefore, to be understood that the appended claims are intended to cover all such modifications and changes as fall within the true spirit of the invention.

What is claimed is:

1. A method for continuously providing a secondary electric current that is approximately proportional to a primary electric current; said primary electric current periodically having a magnitude of approximately zero amps for nonzero periods of time; said primary electric current flowing in a conductor configured as a primary winding of a current transformer, said secondary electric current flowing in a secondary winding of said current transformer; said primary winding and said secondary winding being magnetically coupled;
   a controllable voltage device being connected in series with said secondary winding; said voltage device producing an output voltage affecting the rate that magnetic flux builds up within said current transformer; the build-up of said magnetic flux in said current transformer being associated with a secondary electric current error;
   said method comprising controlling said voltage device so that
   (a) whenever the magnitude of said secondary electric current is greater than a predetermined value said output voltage reduces the rate that said magnetic flux builds up in said current transformer; and
   (b) whenever the magnitude of said secondary electric current is less than said predetermined value said output voltage is controlled so that said secondary electric current error decays while the magnitude of said primary current is approximately zero amps.

2. The method of claim 1 wherein said primary electric current is a pulsed d-c electric current.

3. The method of claim 1 wherein said primary electric current is a pulsed a-c electric current having an unsymmetrical waveform.

4. The method of claim 1 wherein said voltage device is further controlled so that whenever the magnitude of said secondary electric current is less than said predetermined value said output voltage is approximately zero volts.

5. The method of claim 1 wherein whenever the magnitude of said secondary electric current is greater than said predetermined value, said voltage device is controlled so that said output voltage has instantaneous magnitude approximately proportional to the instantaneous magnitude of said secondary electric current, and has polarity so as to facilitate the flow of said secondary electric current.

6. The method of claim 5 wherein said voltage device is further controlled so that whenever the magnitude of said secondary electric current is less than said predetermined value said output voltage is approximately zero volts.

7. The method of claim 1 wherein
   said secondary electric current flows through secondary circuit impedances, said secondary circuit impedances comprising stray impedances of said secondary winding and other impedances connected in series with said secondary winding, the flow of said secondary electric current through said secondary circuit impedances being associated with a voltage drop across said secondary circuit impedances; and
   said voltage device is controlled so that, whenever the magnitude of said secondary electric current is greater than said predetermined value, said output voltage has instantaneous magnitude approximately equal to the instantaneous magnitude of said voltage drop and has polarity so as to facilitate the flow of said secondary electric current.

8. The method of claim 7 wherein said voltage device is further controlled so that whenever the magnitude of said secondary electric current is less than said predetermined value said output voltage is approximately zero volts.

9. The method of claim 1 wherein
   said secondary electric current flows through secondary circuit impedances, said secondary circuit impedances comprising stray impedances of said secondary winding and other impedances connected in series with said secondary winding, the flow of said secondary electric current through said secondary circuit impedances being associated with a voltage drop across said secondary circuit impedances; and
   said voltage device is controlled so that, whenever the magnitude of said secondary electric current is greater than said predetermined value, said voltage device is controlled so that a first average value over time of said output voltage is approximately equal to a second average value over time of said voltage drop, said output voltage having polarity so as to facilitate the flow of said secondary electric current.

10. The method of claim 9 wherein said voltage device is further controlled so that whenever the magnitude of said secondary electric current is less than said predetermined value said output voltage is approximately zero volts.

11. The method of claim 1 wherein a third winding is magnetically coupled to said primary winding and said secondary winding; a voltage across said third winding being proportional to a rate of change of said magnetic flux; said voltage device further being controlled so that whenever the magnitude of said secondary electric current is greater than said predetermined value said output voltage is approximately proportional to said voltage, said output voltage having polarity so as to facilitate the flow of said secondary electric current.

12. The method of claim 11 wherein said voltage device is further controlled so that whenever the magnitude of said secondary electric current is less than said predetermined value said output voltage is approximately zero volts.

13. Apparatus for producing a secondary electric current that is approximately proportional to a primary electric current; said primary electric current periodically having a magnitude of approximately zero amps for nonzero periods of time; said apparatus comprising
   (a) a first winding conducting said primary electric current;

(b) a second winding conducting said secondary electric current;

(c) a magnetic coupling means for providing magnetic coupling between said first winding and said second winding, a build-up of magnetic flux in said magnetic coupling means being associated with secondary electric current error;

(d) a controllable voltage device connected to said second winding and producing an output voltage which affects a rate that said magnetic flux builds up; and (e) a suitable control means for controlling said voltage device; said control means controlling said voltage device so that whenever the magnitude of said secondary electric current is greater than a predetermined value said output voltage reduces the rate that said magnetic flux builds up in said magnetic coupling means, and whenever the magnitude of said secondary electric current is less than said predetermined value said output voltage is controlled so that said secondary electric current error decays while the magnitude of said primary current is approximately zero amps.

14. The apparatus of claim 13 wherein said voltage device is further controlled so that whenever the magnitude of said secondary electric current is less than said predetermined value said output voltage is approximately zero volts.

15. The apparatus of claim 14 wherein said primary electric current is a pulsed electric current;

said magnetic coupling means is a magnetic core of a current transformer, said second winding is a secondary winding of said current transformer, and said first winding is configured as a primary winding of said current transformer; and said apparatus further comprises a current-sensing impedance connected in series with said secondary electric current, a voltage signal across said current-sensing impedance being directly related to said secondary electric current by properties of said current-sensing impedance, said control means further receiving said voltage signal and utilizing said voltage signal to control said output voltage.

16. The apparatus of claim 13 further comprising a current-sensing resistor connected in series with said secondary electric current; a voltage signal across said current-sensing resistor being directly proportional to said secondary electric current; said control means further receiving said voltage signal and controlling said voltage device so that said output voltage is proportional to said voltage signal whenever the magnitude of said secondary electric current is greater than said predetermined value.

17. The apparatus of claim 16 wherein said primary electric current is a pulsed electric current;

said magnetic coupling means is a magnetic core of a current transformer, said second winding is a secondary winding of said current transformer, and said first winding is configured as a primary winding of said current transformer; and said voltage device is further controlled so that whenever the magnitude of said secondary electric current is less than said predetermined value said output voltage is approximately zero volts.

18. The apparatus of claim 13 wherein said secondary electric current flows through secondary circuit impedances, said secondary circuit impedances comprising stray impedances of said second winding and other impedances connected in series with said second winding, the flow of said secondary electric current through said secondary circuit impedances being associated with a voltage drop across said secondary circuit impedances; and said voltage device is controlled so that, whenever the magnitude of said secondary electric current is greater than said predetermined value, said output voltage has instantaneous magnitude approximately equal to the instantaneous magnitude of said voltage drop and has polarity so as to facilitate the flow of said secondary electric current.

19. The apparatus of claim 18 wherein said primary electric current is a pulsed electric current;

said magnetic coupling means is a magnetic core of a current transformer, said second winding is a secondary winding of said current transformer, and said first winding is configured as a primary winding of said current transformer;

said apparatus further comprises a current-sensing impedance connected in series with said secondary electric current, a voltage signal across said current-sensing impedance being directly related to said secondary electric current by properties of said current-sensing impedance, said control means further receiving said voltage signal and utilizing said voltage signal to control said output voltage; and said voltage device is further controlled so that whenever the magnitude of said secondary electric current is less than said predetermined value said output voltage is approximately zero volts.

20. The apparatus of claim 13 wherein said secondary electric current flows through secondary circuit impedances, said secondary circuit impedances comprising stray impedances of said second winding and other impedances connected in series with said second winding, the flow of said secondary electric current through said secondary circuit impedances being associated with a voltage drop across said secondary circuit impedances; and said voltage device is controlled so that, whenever the magnitude of said secondary electric current is greater than said predetermined value, a first average value over time of said output voltage is approximately equal to a second average value over time of said voltage drop, said output voltage having polarity so as to facilitate the flow of said secondary electric current.

21. The apparatus of claim 20 wherein said primary electric current is a pulsed electric current;

said magnetic coupling means is a magnetic core of a current transformer, said second winding is a secondary winding of said current transformer, and said first winding is configured as a primary winding of said current transformer;

said apparatus further comprises a current-sensing impedance connected in series with said secondary electric current, a voltage signal across said current-sensing impedance being directly related to said secondary electric current by properties of said current-sensing impedance, said control means further receiving said voltage signal and utilizing said voltage signal to control said output voltage; and said voltage device is further controlled so that whenever the magnitude of said secondary electric current is less than said predetermined value said output voltage is approximately zero volts.

22. The apparatus of claim 13 further comprising a third winding magnetically coupled to said first winding and said second winding by said magnetic coupling means; a voltage across said third winding being proportional to the rate of change of said magnetic flux; said control means further receiving said voltage and utilizing said voltage to control said voltage device.

23. The apparatus of claim 22 wherein said primary electric current is a pulsed electric current;

said magnetic coupling means is a magnetic core of a current transformer, said second winding is a secondary winding of said current transformer, and said first winding is configured as a primary winding of said current transformer; and said voltage device is further controlled so that whenever the magnitude of said secondary electric current is less than said predetermined value said output voltage is approximately zero volts, and whenever the magnitude of said secondary electric current is greater than said predetermined value said output voltage is approximately proportional to said voltage.

* * * * *